United States Patent
Yamashita

(10) Patent No.: US 6,765,828 B2
(45) Date of Patent: Jul. 20, 2004

(54) NON-VOLATILE SEMICONDUCTOR STORAGE DEVICE AND METHOD OF READING OUT DATA

(75) Inventor: Minoru Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/356,496

(22) Filed: Feb. 3, 2003

(65) Prior Publication Data

US 2003/0117841 A1 Jun. 26, 2003

Related U.S. Application Data

(63) Continuation of application No. PCT/JP00/05223, filed on Aug. 3, 2000.

(51) Int. Cl.[7] .............................................. G11C 16/04
(52) U.S. Cl. .................. 365/185.18; 365/226; 365/228; 365/185.19; 365/185.25
(58) Field of Search ............................ 365/185.18, 226, 365/228, 185.19, 185.25, 185.16, 185.21, 189.07, 189.09, 189.11, 189.12, 191, 204

(56) References Cited

U.S. PATENT DOCUMENTS

| | | | |
|---|---|---|---|
| 5,027,321 A | | 6/1991 | Park |
| 5,157,626 A | * | 10/1992 | Watanabe .................... 365/185 |
| 5,457,652 A | * | 10/1995 | Brahmhatt ............. 365/185.06 |
| 5,715,191 A | * | 2/1998 | Yamauchi et al. .......... 365/156 |
| 5,789,967 A | * | 8/1998 | Katoh ......................... 327/408 |
| 6,181,629 B1 | * | 1/2001 | Ogura ......................... 365/227 |
| 6,249,458 B1 | * | 6/2001 | Shokouhi et al. ....... 365/185.23 |

FOREIGN PATENT DOCUMENTS

| | | |
|---|---|---|
| JP | 3-176895 | 7/1991 |
| JP | 9-245478 | 9/1997 |
| JP | 9-246404 | 9/1997 |

\* cited by examiner

*Primary Examiner*—Connie C. Yoha
(74) *Attorney, Agent, or Firm*—Arent Fox PLLC

(57) ABSTRACT

A non-volatile semiconductor storage device provided with a boost circuit for setting, for at least a certain period of time, a source line selectively connected to a memory cell to a negative potential, when reading out data from the memory cell is disclosed.

8 Claims, 3 Drawing Sheets

NON-VOLATILE SEMICONDUCTOR STORAGE DEVICE AND METHOD OF READING OUT DATA

CROSS-REFERENCE TO RELATED APPLICATIONS

This is a continuation of Application PCT/JP00/05223, filed Aug. 3, 2000.

BACKGROUND OF THE INVENTION

1. Field of the Invention

The present invention relates to non-volatile semiconductor storage devices, in particular to a non-volatile semiconductor storage device operating under a method of reading out data from a cell of the virtual ground type, and a method of reading out data.

2. Description of the Related Art

Recently, with the spread of portable equipment, memories are shifting to become of greater capacity and lower voltage. Furthermore, with the speed-up in the operation of the CPU, there is a stronger demand to speed-up the operation of memory. The virtual ground type is known as a way to achieve a large capacity memory. The virtual ground type increases the density of the cells by reducing the number of contacts of the cell and thus is suitable for a large capacity memory. However, the method of reading out data from the cell becomes more complex and thus is not suitable for a low voltage and high-speed memory.

Conventionally, in regards to reading out data from cells of the virtual ground type, a method (hereinafter also referred to as the first conventional method) of pre-charging all of the bit lines to cancel out the leak current from the adjacent cells and then detecting the level or the current on the side of the drain; and a method (hereinafter also referred to as the second conventional method) of detecting the level on the side of the source where the influence of the leak current of the cells is smaller, are used. The second conventional method is disclosed in, for example, Japanese Laid-Open Patent Application 3-176895.

In the first conventional method, since the bit lines are pre-charged, the power consumption is increased.

Furthermore, in the second conventional method, because the operation of reading out data from the side of the source is carried out between the ground potential and the positive potential, a problem arises in that it becomes difficult to maintain a sufficient margin for reading. This problem becomes more significant as the operating voltage decreases. Moreover, considering the fact that leak current from the adjacent cells still exists even when reading from the side of the source, there is a limit in extending the margin for reading.

SUMMARY OF THE INVENTION

Accordingly, it is a general object of the present invention to provide a non-volatile semiconductor storage device and a method of reading out data that solves the problems of the prior art and ensures sufficient reading margin.

In order to achieve the above object, the non-volatile storage device of the present invention is a non-volatile semiconductor storage device provided with a boost circuit for setting, for at least a certain period of time, a source line selectively connected to a memory cell to a negative potential, when reading out data from the memory cell.

As the potential of the source line is set to a negative potential, when the memory cell is a write cell, the source line remains at a negative potential even if the data is read out from the memory cell, whereas when the memory cell is an erase cell, the current flows into the source line and the potential of the source line increases beyond the ground level to a positive potential. Thus, the reading margin is the difference between such negative potential and the positive potential and an extended reading margin can be obtained. Even at the time of low-voltage operation, the reading margin can reliably sense the change in the potential of the source line because the negative voltage is set as the reference voltage.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
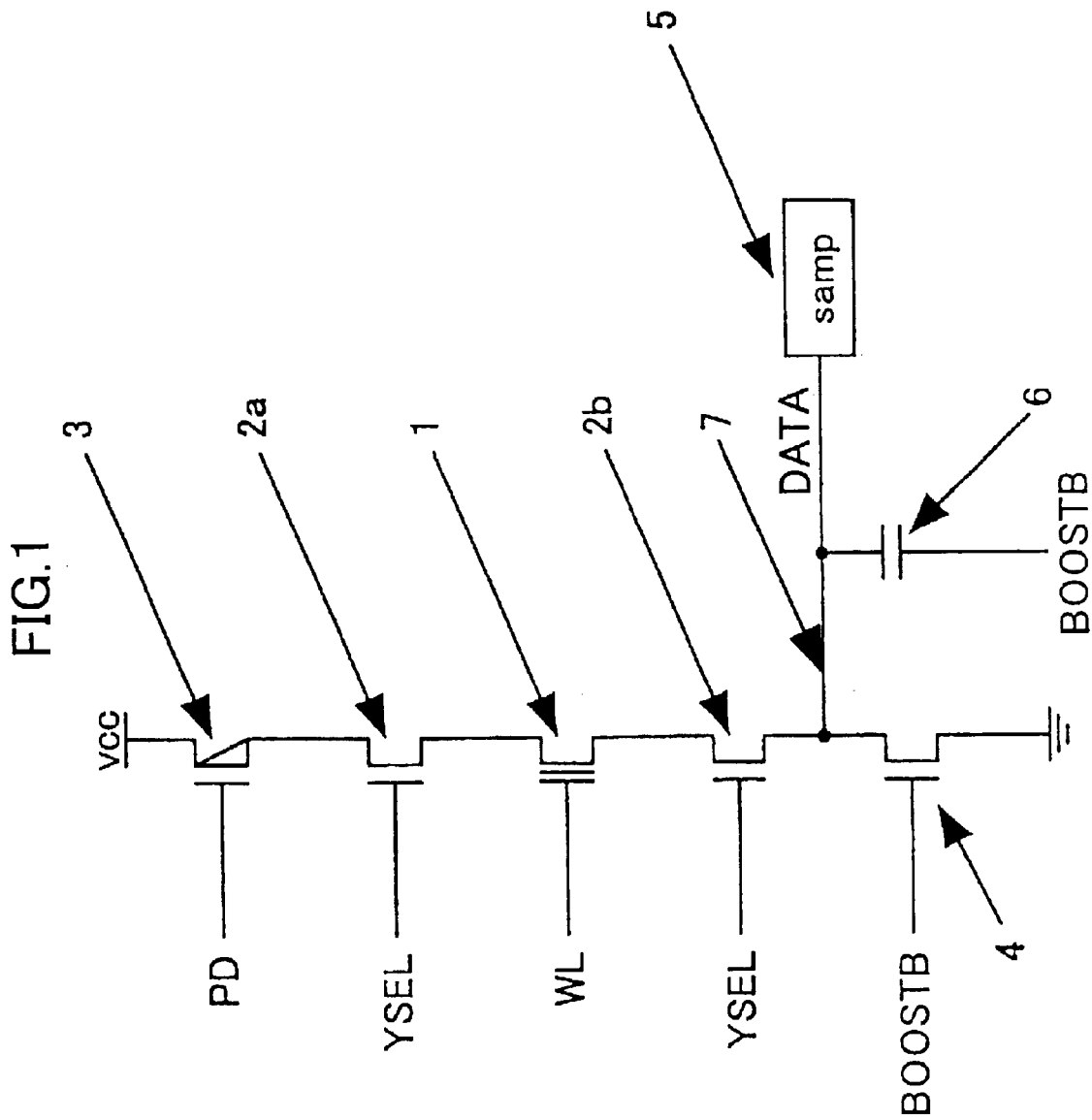
FIG. 1 is a circuit diagram showing the principle of the present invention.

FIG. 1 is a circuit diagram showing the principle of the present invention. FIG. 1 shows one memory cell 1 and a circuit construction around such memory cell 1.

The memory cell 1 is a non-volatile transistor that is electrically programmable and electrically erasable. The memory cell 1 includes a source, a drain, a control gate, and a floating gate.

The drain of the memory cell 1 is connected to a positive supply voltage VCC via a transistor 2a of Y decoder and a transistor 3 of a load part. The transistor 3 is turned on when receiving a low-level load signal PD. The transistor 2a is turned on when receiving a high-level select signal YSEL. The memory cell 1 is turned on when receiving a high-level word line drive signal WL.

The source of the memory cell 1 (connected to the bit line) is grounded via a transistor 2b of Y decoder and a transistor 4 for discharging the source line. The connecting point of the transistor 2b and the transistor 4 is connected to a source line 7 that is in turn connected to a sense amplifier (samp) 5. The transistor 2b is turned on when receiving a high-level select signal YSEL. The transistor 4 is turned on when receiving a high-level boost signal BOOSTB. In other words, the bit line leading to the memory cell 1 is selectively grounded (virtual ground).

To the source line 7, one end of a capacitor 6, for boosting the source line 7 to a negative potential, is connected. The other end of the capacitor 6 is supplied with a boost signal BOOSTB.

One feature of the circuit shown in FIG. 1 is that the transistor 4 and the capacitor 6 are provided, so that the source line 7 can be boosted to a negative potential when reading data out from the memory cell 1. Thus, the margin necessary for reading can be sufficiently ensured.

Figure 2:
FIG. 2 is a wave form chart showing the principle of the present invention and operations according to one embodiment of the present invention.

FIG. 2 shows a wave form chart showing the operation of the circuit shown in FIG. 1. First of all, as shown in FIG. 2(c), the boost signal BOOSTB rises from 0V (ground level) to the supply voltage VCC at the beginning of the reading operation. As will be explained later, the boost signal BOOSTB corresponds to, for example, a signal generated when a change in address is detected. When the boost signal BOOSTB rises to the supply voltage VCC, the transistor 4 is turned on and the potential of the source line 7 is securely set to 0V (FIG. 2 (*a*)). Hence, the capacitor 6 starts to be charged.

Furthermore, one bit line is selected by the address after the change. If the memory cell 1 in FIG. 1 is selected, the select signal YSEL rises to the supply voltage VCC thus turning on the transistors 2*a* and 2*b*, and similarly, the word line WL rises to the supply voltage VCC (FIG. 2 (*b*)) thus turning on the memory cell 1. At this point, the load signal PD of the bit line is at the supply voltage (OFF state).

Next, the boost signal BOOSTB falls to 0V. The boost signal BOOSTB is a pulse-form signal that rises to the supply voltage VCC only for a defined period of time. The moment the boost signal BOOSTB falls to 0V, the potential of the source line 7 decreases by the amount of voltage between the ends of the capacitor 6 and becomes a negative potential $V_-$ (FIG. 2 (*a*)). In other words, the source line 7 is boosted to the negative potential $V_-$.

Furthermore, when the boost signal BOOSTB falls to 0V, the load signal PD falls from the supply voltage VCC to 0V (FIG. 2 (*d*)) and the transistor 3 is turned on.

In this case, when data is written into the memory cell 1 (data bit "0"), or when a negative charge is applied to the floating gate, the memory cell 1 will not be turned on even if supply voltage VCC is applied to the control gate. Thus, the potential of the source line 7 remains to be a negative potential $V_-$ (DATA"0" of FIG. 2 (*a*)).

In contrast, when data is not written into the memory cell 1 (data bit "1"), or when in the erase state, the source line 7 is charged. In other words, the current flows from the supply voltage VCC, through the transistors 3, 2*a*, 1, and 2*b*, into the source line 7, and then out through the capacitor 6 to the ground. Thus, the potential of the source line 7 gradually rises from the negative potential $V_-$, beyond the ground level (0V) to a certain positive potential towards the supply voltage VCC (DATA "1" of FIG. 2 (*a*)). Such positive potential is a value derived by subtracting the sum of the threshold voltages of the transistors 3, 2*a*, 1, and 2*b* from the supply voltage VCC.

Consequently, DATA "0" and DATA "1" become the reading margins. DATA "0" and DATA "1" can be distinguished by setting the threshold value ref for reading between such reading margins.

The conventional construction is a circuit construction in which the transistor 4 and the capacitor 6 of FIG. 1 are not provided. Thus, the potential of the DATA "0" is the ground level of 0V. In other words, the reading margin is smaller than the present invention by the amount (0V-$V_-$). Thus, compared to the circuit construction of FIG. 1, it is difficult to obtain adequate margins for reading. Furthermore, when the operating supply voltage becomes a low voltage, the reading margin with the ground level as the reference level becomes smaller and it becomes extremely difficult to obtain sufficient margins for reading. In contrast, in the circuit construction of FIG. 1, although the reading margin becomes smaller by having the negative voltage $V_-$ as the reference voltage, it is still possible to ensure sufficient margins. Thus, the influence of the leak current of the adjacent memory cells is small.

Figure 3:
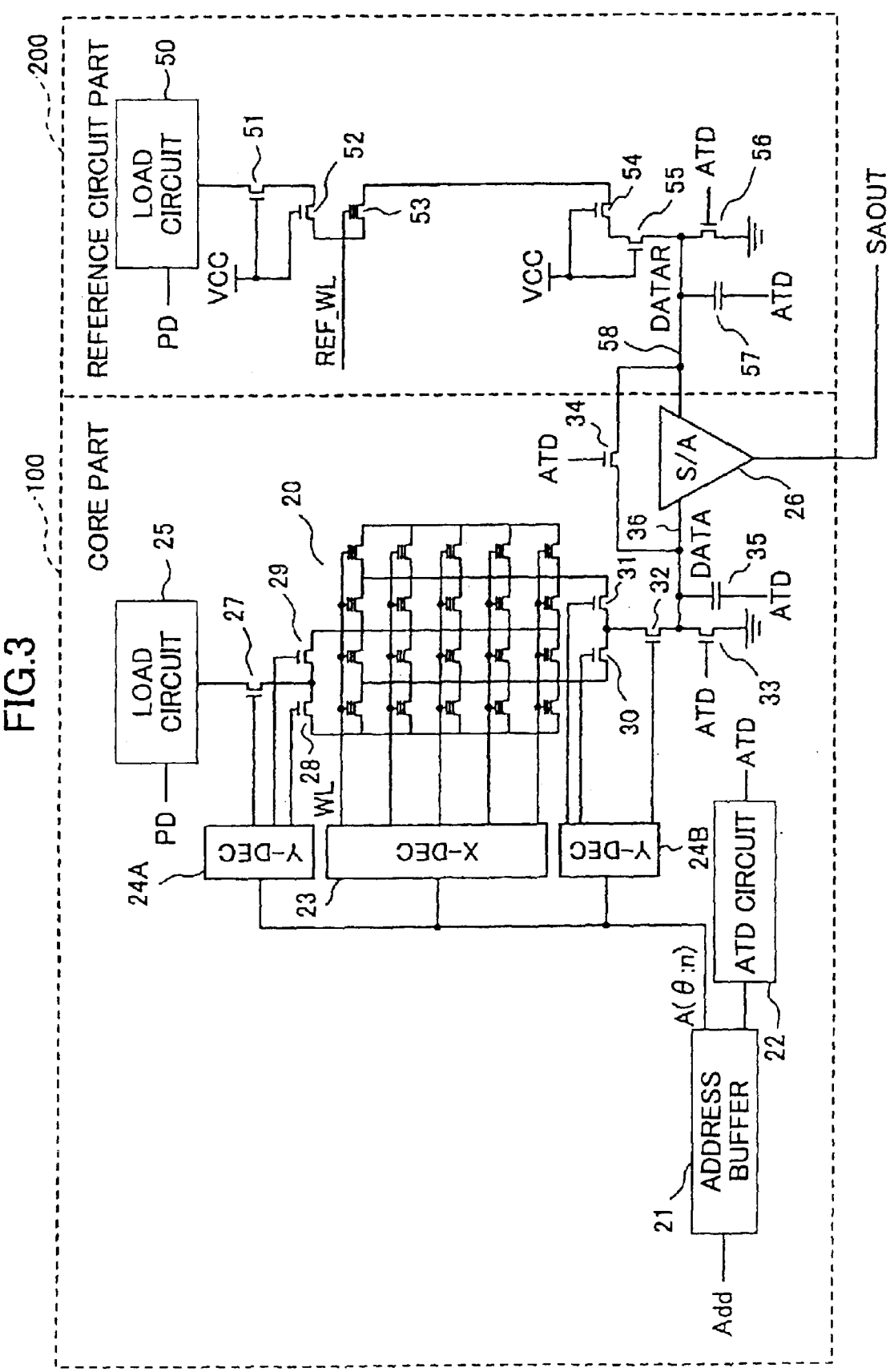
FIG. 3 is a circuit diagram showing a non-volatile semiconductor storage device according to one embodiment of the present invention.

FIG. 3 is a block diagram showing an overall construction of the non-volatile semiconductor storage device according to the embodiment of the present invention.

The non-volatile semiconductor storage device shown in the figure includes a core part 100 and a reference circuit part 200. The core part 100 includes a storing section for storing the actual data, and the reference circuit part 200 includes a section for setting and outputting the threshold value ref explained above.

The core part 100 includes a memory cell array 20, an address buffer 21, an ATD (Address Transition Detection) circuit 22, an X decoder (X-DEC) 23, Y decoders (Y-DEC) 24A, 24B, a load circuit 25, a sense amplifier (S/A) 26, transistors 27–34, and a capacitor 35. Furthermore, reference number 36 denotes a source line.

It is to be noted that the transistor 33 of FIG. 3 corresponds to the transistor 4 of FIG. 1, and the capacitor 35 of FIG. 3 corresponds to the capacitor 6 of FIG. 1. The ATD signal output from the ATD circuit 22 of FIG. 3 corresponds to the boost signal BOOSTB in FIG. 1. The load circuit 25 of FIG. 3 corresponds to the transistor 3 of FIG. 1 and the transistors 27–29 correspond to the transistor 2*a* of FIG. 1. Furthermore, the transistors 30–32 of FIG. 3 correspond to the transistor 2*b* of FIG. 1, and one of the memory cell transistors of the memory cell array 20 of FIG. 3 corresponds to the memory cell 1 of FIG. 1. Furthermore, the sense amplifier 26 of FIG. 3 corresponds to the sense amplifier 5 of FIG. 1.

The reference circuit part 200 includes a load circuit 50, transistors 51, 52, 54–56, a memory cell transistor 53, and a capacitor 57. Furthermore, reference number 58 denotes a source line. The transistors 51 and 52 correspond to the transistors 27 and 28 (29) of the core part 100, and the transistors 54 and 55 correspond to the transistors 30 (31) and 32 of core part 100. Furthermore, the capacitor 57 corresponds to the capacitor 35 of the core part 100, and the transistor 56 corresponds to the transistor 33 of the core part 100. The supply voltage VCC is applied to the gates of the transistors 51, 52, 54, and 55.

One feature of the construction of FIG. 3 is that transistors 33, 56, and capacitors 35, 57 are newly provided. The transistor 33 and the capacitor 35 form the boost circuit for the source line 36 of the core part 100. Furthermore, the transistor 56 and the capacitor 57 form the boost circuit for the source line 58 of the reference circuit part 200. The transistor 33 and the capacitor 35 are similar to the transistor 4 and the capacitor 6 explained with reference to FIG. 1. Similarly, the transistor 56 and the capacitor 57 are provided in the reference circuit part 200.

Next, the operation of the non-volatile semiconductor storage device of FIG. 3 will be explained by referring to FIG. 2 when appropriate.

The external address signal Add is buffered in the address buffer 21 and then output to the ATD circuit 22 as well as to the X decoder 23 and the Y decoders 24A, 24B. The ATD circuit 22 generates the ATD signal when detecting change in the address signal Add (FIG. 2(C)). The ATD signal is provided to the transistors 33, 34, 56, and to the capacitors 35, 57. Thus, the source lines 36 and 58 are short-circuited and simultaneously set to the ground level (0V).

The X decoder 23 decodes the address signal Add and selects one word line. Furthermore, the X decoder 23 outputs the select signal REF_WL to the control gate of the memory cell 53 on the side of the reference circuit part 200 each time it decodes the address signal Add (FIG. 2 (*b*)). The Y decoder 24A decodes the address signal Add and turns on the transistor 27 and transistor 28 or 29. Similarly, the Y decoder 24B decodes the address signal Add and turns on the transistor 32 and the transistor 30 or 31. Thus, one of the memory cells of the memory cell array 20 and the memory cell 53 on the side of the reference circuit part 200 are selected.

The ATD signal then falls (FIG. 2 (c)). Thus, the transistors 33, 56 and 34 are turned off. At this point, the source line 36 of the core part 100 is set to a negative potential, as mentioned above. Similarly, the source line 58 of the reference circuit part 200 is set to a negative potential.

With the fall of the ATD signal, the load signal PD falls from the supply voltage VCC to the ground level (FIG. 2 (d)). Thus, the supply voltage VCC is supplied from the load circuit 25, 50 to the transistors 27, 51, respectively.

If the selected memory cell stores DATA "1", the current flows from the load circuit 25, and passes through the transistors 27, 28 (or 29), the selected memory cell, the transistor 30 (or 31), the transistor 32, and the capacitor 35. Thus, the potential of the source line 36 rises above the ground level to a positive potential, as shown in FIG. 2 (a). If the selected memory cell stores DATA "0", the level of the source line 36 remains to be a negative potential V_.

On the other hand, the source line 58 of the reference circuit part 200 rises when the ATD signal falls to 0V and the load signal falls to 0V, as with the ref in FIG. 2 (a). The threshold value ref is an arbitrary potential set between the DATA "0" and the DATA "1". The reference potential ref passes through the source line 58 and is applied to the sense amplifier 26, as DATAR.

The sense amplifier 26 compares the data DATA read out from the selected memory cell and the threshold value DATAR, and outputs the comparison result as the sense amplifier output signal SAOUT. In other words, the sense amplifier 26 compares the potential of the source line 36 and the potential of the source line 58, and outputs the sense amplifier SAOUT according to the magnitude relation of such comparison.

Thus, because the source lines 36, 58 are boosted to the negative potential V_ while reading out data, the margin for reading can be extended, and can respond to the low operating voltage.

One embodiment of the present invention has been explained. The writing and erasing operations are those generally known. Furthermore, the internal construction of the address buffer 21, the ATD circuit 22, the X decoder 23, the Y decoders 24A, 24B, the load circuits 25, 50 and the sense amplifier 26 are also those generally known.

The circuit structure and the operations shown in FIG. 1 through FIG. 3 should not in any way be interpreted as limiting the present invention. For example, the boost circuit including the capacitor 35 and the transistor 33 can be replaced by another circuit having a similar function. Although the transistor 34 short-circuits both the source line 36 and 58 to set the source lines to the ground level, the transistor 34 may be omitted.

The present invention is not limited to these embodiments, but variations and modifications may be made without departing from the scope of the present invention.

What is claimed is:

1. A non-volatile semiconductor storage device comprising:
    a memory cell;
    a source line selectively connected to the memory cell;
    a boost circuit including a capacitor, one end of said capacitor being connected to said source line and the other end of said capacitor being selectively supplied with a voltage signal generated when an address provided to the non-volatile semiconductor storage device is changed, and a transistor having a control electrode supplied with the voltage signal for selectively grounding said source line in accordance with said voltage signal; and
    said boost circuit setting, for at least a certain period of time, the source line to a negative potential, when reading out data from said memory cell.

2. A non-volatile semiconductor storage device comprising a core part provided with a memory cell array and a reference circuit part, wherein
    said core part comprises:
        a first source line selectively connected to a memory cell within the memory cell array;
        a first boost circuit including a capacitor, one end of said capacitor being connected to said first source line and the other end of said capacitor being selectively supplied with a voltage signal generated when an address provided to the non-volatile semiconductor storage device is changed, and a transistor having a control electrode supplied with voltage signal for selectively grounding said first source line in accordance with said voltage signal; and
        said first boost circuit setting, for at least a certain period of time, the first source line a negative potential, when reading out data from said memory cell;
    said reference circuit part comprises a second boost circuit for setting, for at least a certain period of time, a second source line to a negative potential, when reading out data from the memory cell within said memory cell array; and
    said core part further comprises a sense amplifier for comparing the potential of said first source line and the potential of said second source line.

3. The non-volatile semiconductor storage device as claimed in claim 2, wherein
    said second boost circuit includes a second capacitor, one end of said second capacitor being connected to said second source line and the other end of said second capacitor being selectively supplied with said voltage signal.

4. The non-volatile semiconductor storage device as claimed in claim 2, wherein
    said second boost circuit includes a second capacitor, one end of said second capacitor being connected to said second source line and the other end of said second capacitor being selectively supplied with said voltage signal, and a second transistor for selectively grounding said second source line in accordance with said voltage signal.

5. The non-volatile semiconductor storage device as claimed in claim 3, wherein said non-volatile semiconductor storage device further comprises a short-circuit for shorting said first source line and said second source line in accordance with said voltage signal.

6. The non-volatile semiconductor storage device as claimed in claim 4, wherein said non-volatile semiconductor storage device further comprises a short-circuit for shorting said first source line and said second source line in accordance with said voltage signal.

7. The non-volatile semiconductor storage device as claimed in claim 2, wherein said non-volatile semiconductor storage device further comprises a circuit for detecting a change in address signal and outputting a detecting signal; and
    said first and second boost circuits set, for at least a certain period of time, said first and said second source lines to said negative potential, respectively, when said detecting signal is applied.

8. A method of reading out data from a memory cell of a non-volatile semiconductor storage device comprising:

a source line selectively connected to the memory cell;

a boost circuit including a capacitor, one end of said capacitor being connected to said source line and the other end of said capacitor being selectively supplied with a voltage signal generated when an address provided to the non-volatile semiconductor storage device is changed, and a transistor having a control electrode supplied with the voltage signal for selectively grounding said source line in accordance with said voltage signal; and wherein said method comprises a step of setting, for at least a certain period of time, the source line to a negative potential, when reading out data from the memory cell.

* * * * *